United States Patent
Seng et al.

(10) Patent No.: US 9,768,120 B2
(45) Date of Patent: Sep. 19, 2017

(54) SEMICONDUCTOR DEVICE ASSEMBLY INCLUDING A CHIP CARRIER, SEMICONDUCTOR WAFER AND METHOD OF MANUFACTURING A SEMICONDUCTOR DEVICE

(71) Applicant: Infineon Technologies Austria AG, Villach (AT)

(72) Inventors: Philipp Seng, Munich (DE); Khalil Hosseini, Weihmichl (DE); Anton Mauder, Kolbermoor (DE)

(73) Assignee: Infineon Technologies Austria AG, Villach (AT)

(*) Notice: Subject to any disclaimer, the term of this patent is extended or adjusted under 35 U.S.C. 154(b) by 342 days.

(21) Appl. No.: 13/683,393

(22) Filed: Nov. 21, 2012

(65) Prior Publication Data
US 2014/0138833 A1    May 22, 2014

(51) Int. Cl.
*H01L 23/538* (2006.01)
*H01L 21/78* (2006.01)
(Continued)

(52) U.S. Cl.
CPC .......... *H01L 23/538* (2013.01); *H01L 21/78* (2013.01); *H01L 24/03* (2013.01); *H01L 24/05* (2013.01); *H01L 24/32* (2013.01); *H01L 24/83* (2013.01); *H01L 24/94* (2013.01); *H01L 29/0657* (2013.01); *H01L 23/3735* (2013.01); *H01L 23/49513* (2013.01); *H01L 24/29* (2013.01); *H01L 2224/03001* (2013.01);
(Continued)

(58) Field of Classification Search
CPC ............... H01L 23/538; H01L 23/5383; H01L 23/53252; H01L 23/53204; H01L 21/62; H01L 2021/60; H01L 2021/6027; H01L 21/60007; H01L 21/76841–21/76876; H01L 23/53223; H01L 23/53238; H01L 23/53266
USPC .................................................. 257/620, 692
See application file for complete search history.

(56) References Cited

U.S. PATENT DOCUMENTS 6,680,524 B2 * 1/2004 Minamio et al. ............. 257/678
6,759,745 B2 * 7/2004 Masumoto .......... H01L 21/6835
257/730
(Continued)

FOREIGN PATENT DOCUMENTS

CN 1921098 A 2/2007
CN 102097404 A 6/2011

*Primary Examiner* — Marc Armand
*Assistant Examiner* — Quinton Brasfield
(74) *Attorney, Agent, or Firm* — Murphy, Bilak & Homiller, PLLC

(57) ABSTRACT

A semiconductor device includes a chip carrier and a semiconductor die with a semiconductor portion and a conductive structure. A soldered layer mechanically and electrically connects the chip carrier and the conductive structure at a soldering side of the semiconductor die. At the soldering side an outermost surface portion along an edge of the semiconductor die has a greater distance to the chip carrier than a central surface portion. The conductive structure covers the central surface portion and at least a section of an intermediate surface portion tilted to the central surface portion. Solder material is effectively prevented from coating such semiconductor surfaces that are prone to damages and solder-induced contamination is significantly reduced.

8 Claims, 11 Drawing Sheets

(51) Int. Cl.
*H01L 29/06* (2006.01)
*H01L 23/00* (2006.01)
H01L 23/373 (2006.01)
H01L 23/495 (2006.01)

(52) U.S. Cl.
CPC ............ *H01L 2224/0347* (2013.01); *H01L 2224/03462* (2013.01); *H01L 2224/04026* (2013.01); *H01L 2224/05018* (2013.01); *H01L 2224/05124* (2013.01); *H01L 2224/05139* (2013.01); *H01L 2224/05144* (2013.01); *H01L 2224/05155* (2013.01); *H01L 2224/05164* (2013.01); *H01L 2224/05166* (2013.01); *H01L 2224/05169* (2013.01); *H01L 2224/05172* (2013.01); *H01L 2224/05184* (2013.01); *H01L 2224/05187* (2013.01); *H01L 2224/05558* (2013.01); *H01L 2224/05564* (2013.01); *H01L 2224/05582* (2013.01); *H01L 2224/05639* (2013.01); *H01L 2224/05644* (2013.01); *H01L 2224/26145* (2013.01); *H01L 2224/291* (2013.01); *H01L 2224/2912* (2013.01); *H01L 2224/29116* (2013.01); *H01L 2224/32058* (2013.01); *H01L 2224/32225* (2013.01); *H01L 2224/32245* (2013.01); *H01L 2224/83365* (2013.01); *H01L 2224/83455* (2013.01); *H01L 2224/83815* (2013.01); *H01L 2224/83825* (2013.01); *H01L 2224/94* (2013.01); *H01L 2924/00014* (2013.01); *H01L 2924/10157* (2013.01); *H01L 2924/10158* (2013.01); *H01L 2924/12042* (2013.01); *H01L 2924/1301* (2013.01); *H01L 2924/1305* (2013.01); *H01L 2924/1306* (2013.01); *H01L 2924/13055* (2013.01); *H01L 2924/13091* (2013.01); *H01L 2924/15747* (2013.01)

(56) References Cited

U.S. PATENT DOCUMENTS

| | | | | |
|---|---|---|---|---|
| 7,675,153 | B2* | 3/2010 | Kurosawa et al. | 257/686 |
| 7,691,726 | B2* | 4/2010 | Seng | 438/462 |
| 8,154,135 | B2* | 4/2012 | Kim et al. | 257/774 |
| 2007/0215980 | A1* | 9/2007 | Otremba | H01L 23/3107 257/578 |
| 2009/0032966 | A1* | 2/2009 | Lee et al. | 257/774 |
| 2010/0193934 | A1* | 8/2010 | Satou | H01L 23/3107 257/692 |
| 2011/0070695 | A1* | 3/2011 | Bayerer | H01L 24/49 257/E21.499 |
| 2011/0156238 | A1* | 6/2011 | Hsu et al. | 257/692 |
| 2011/0272806 | A1* | 11/2011 | Akram | H01L 21/76898 257/738 |
| 2012/0313224 | A1* | 12/2012 | Fukuda | H01L 21/78 257/622 |

* cited by examiner

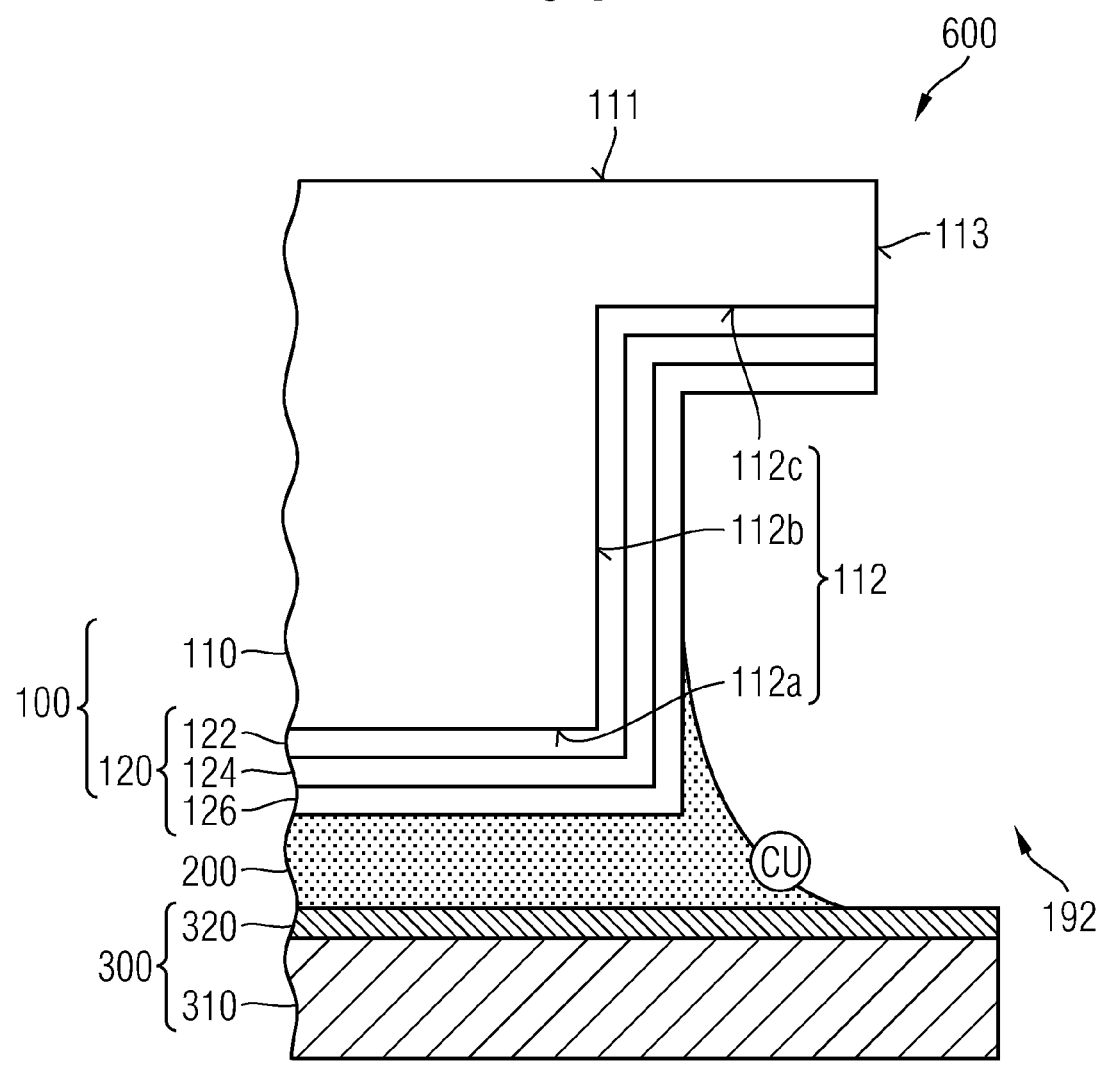

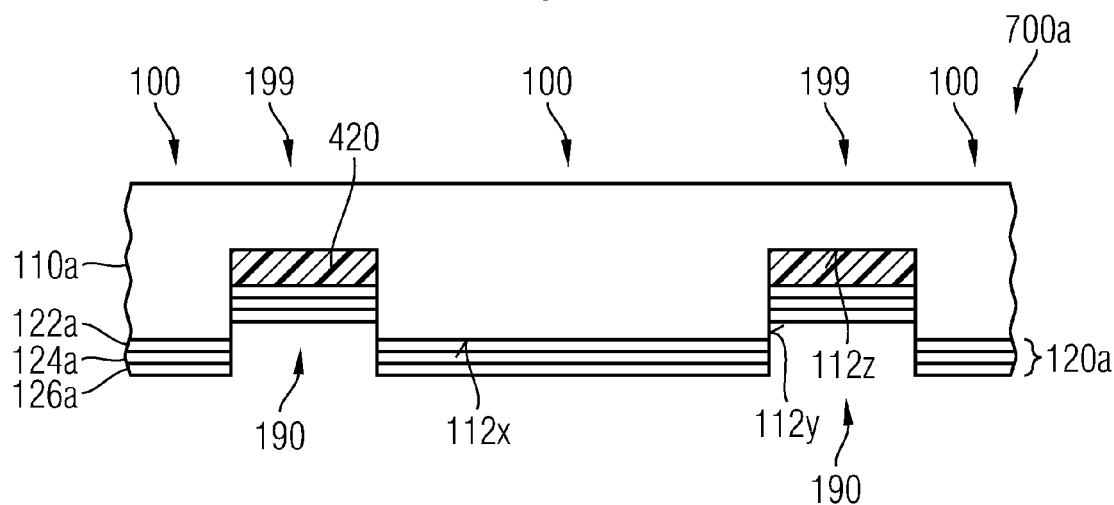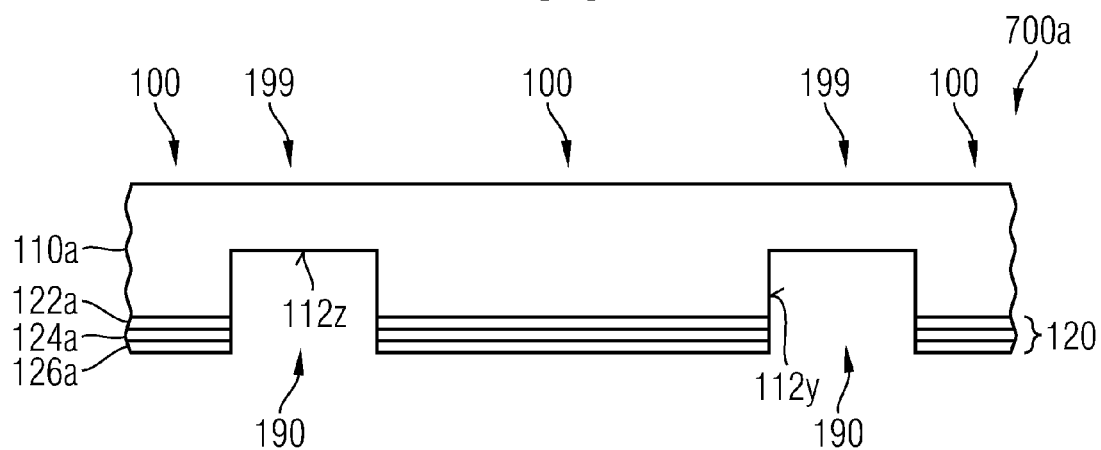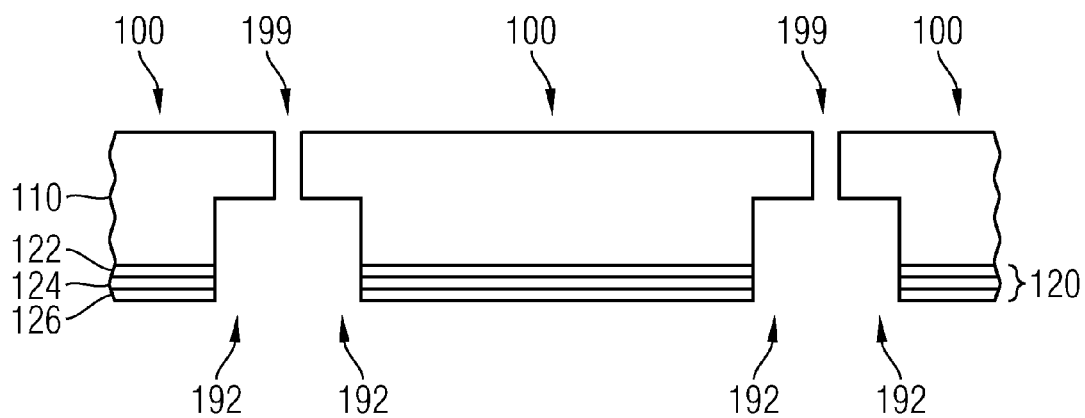

US 9,768,120 B2

SEMICONDUCTOR DEVICE ASSEMBLY INCLUDING A CHIP CARRIER, SEMICONDUCTOR WAFER AND METHOD OF MANUFACTURING A SEMICONDUCTOR DEVICE

BACKGROUND

The manufacture of semiconductor devices is based on wafer composites of semiconductor dies, wherein most of the processes including photolithographic patterning, etching and deposition are applied from a wafer front side. After the functional elements of the semiconductor devices have been formed in the wafer composite, for semiconductor devices like power MOSFETs (metal oxide field effect transistors) a conductive layer is provided on the wafer rear side surface. Then the wafer may be sawn to obtain individual semiconductor dies. The rear side surface of the semiconductor die with a conductive structure resulting from the conductive layer is soldered on a chip carrier to obtain a semiconductor device assembly deployable in electronic circuits. It is desirable to manufacture reliable semiconductor devices assemblies.

SUMMARY

According to an embodiment, a semiconductor device assembly includes a chip carrier and a semiconductor die that includes a semiconductor portion and a conductive structure. A soldered layer mechanically and electrically connects the chip carrier and the conductive structure at a soldering side of the semiconductor die. At the soldering side an outermost surface portion along an edge of the semiconductor die has a greater distance to the chip carrier than a central surface portion. The conductive structure covers the central surface portion and at least a section of an intermediate surface portion that is tilted to the central surface portion and that connects the central and outermost surface portions.

According to another embodiment, a semiconductor wafer includes semiconductor dies arranged in a matrix and a kerf portion. Each semiconductor die includes a conductive structure on a central die surface at a rear side of the semiconductor wafer. The kerf portion mechanically connects the semiconductor dies and forms a rectangular grid with the semiconductor dies arranged in the meshes. Between the central die surfaces a lattice-like separation trench extends into the semiconductor wafer from the rear side. The separation trench is wider than the kerf portion. The conductive structures extend into the separation trench.

Another embodiment refers to a method of manufacturing a semiconductor device. From a rear side surface, a lattice-like separation trench is formed in a semiconductor portion of a semiconductor wafer that includes a plurality of identical semiconductor dies arranged in a matrix. A kerf portion forms a grid and mechanically connects the semiconductor dies. The separation trench extends along the kerf portion and is wider than the kerf portion. A conductive structure extending into the separation trench is provided on the rear side surface for each semiconductor die. The semiconductor dies are separated along the kerf portion.

Another method of manufacturing a semiconductor device provides forming, from a rear side surface, a lattice-like separation trench in a semiconductor portion of a semiconductor wafer that includes a plurality of identical semiconductor dies which are arranged in a matrix. A kerf portion forms a grid and mechanically connects the semiconductor dies. The separation trench extends along the kerf portion and is wider than the kerf portion. A bottom portion of the separation trench is filled with a second auxiliary material. A conductive structure is deposited in a non-conformal manner, wherein the conductive structure covers central die surfaces surrounded by the separation trench respectively and trench bottom surfaces. The second auxiliary material is removed wherein the conductive structure is lifted off in the separation trench. The semiconductor dies are separated along the kerf portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3A is a schematic cross-sectional view of a portion of a semiconductor device assembly in accordance with an embodiment providing a fully covered step at the soldering side of a semiconductor die.

FIG. 6A is a schematic cross-sectional view of a portion of a semiconductor wafer for illustrating a method of manufacturing semiconductor devices in accordance with an embodiment providing conductive structures in central surfaces portions at the solder side after providing a conductive layer.

FIG. 6B shows the semiconductor wafer portion of FIG. 6A after removing a second auxiliary material.

FIG. 6C shows semiconductor dies obtained from the semiconductor wafer portion of FIG. 6B.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

Figure 1A:
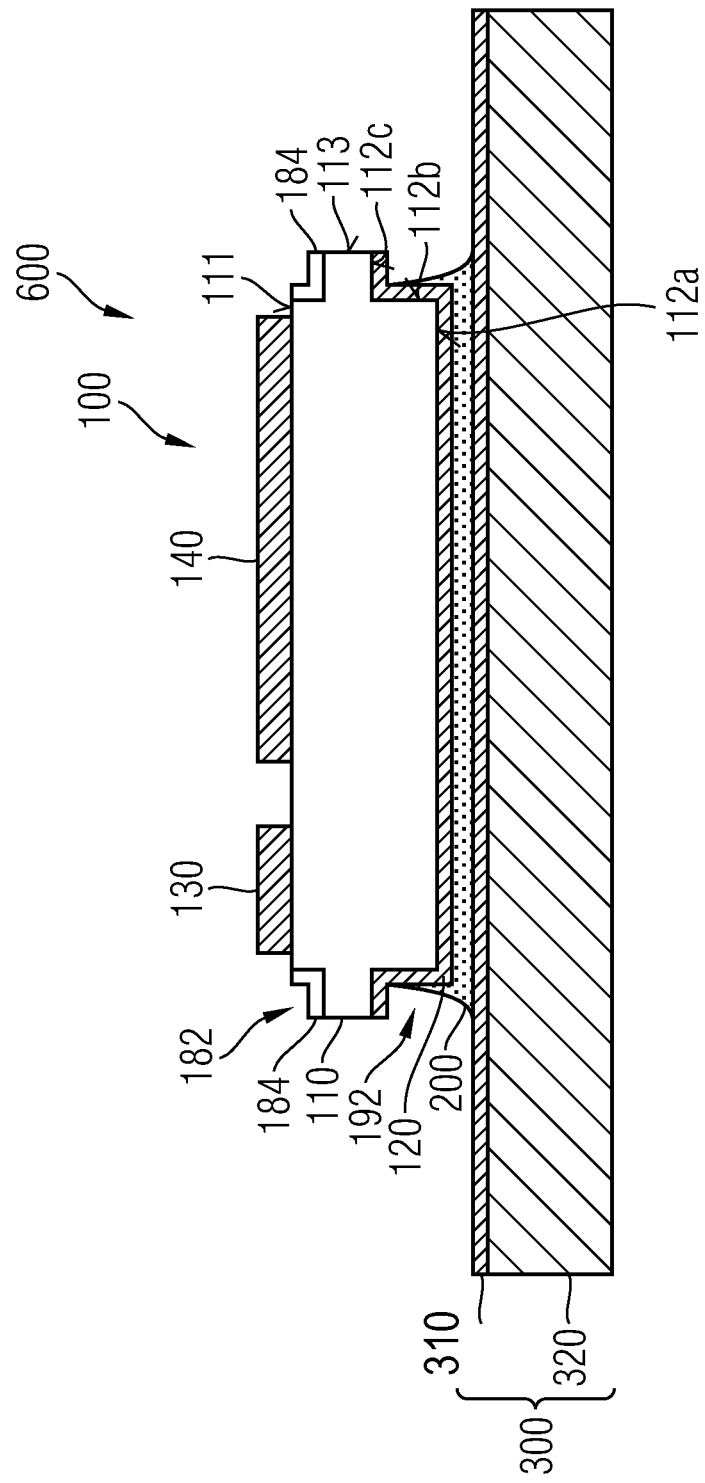
FIG. 1A is a schematic cross-sectional view of a semiconductor device assembly according to an embodiment.

FIG. 1A shows a semiconductor device 600 with a semiconductor die 100 soldered onto a chip carrier 300. The chip carrier 300 may include a conductive base 310 and a conductive auxiliary structure 320. According to an embodiment, the conductive base 310 is a metal substrate, e.g. a copper lead frame. According to another embodiment, the conductive base 310 is a layer provided on a dielectric or ceramic base substrate. For example, the chip carrier 300 is a DCB (direct copper bonded) substrate including a ceramic base substrate and an intermediate layer provided from alumina $Al_2O_3$ or aluminum nitride AlN. The conductive base 310 may be a copper layer having a thickness in a range from 200 to 2000 μm. The copper layer may be bonded to the intermediate layer in a high temperature fusing process.

According to another embodiment, the chip carrier 300 is a PCB (printed circuit board) with a contact pad forming the conductive base 310.

The conductive auxiliary structure 320 may be or may include a protection layer protecting the conductive base 310 against oxidation, a diffusion barrier layer suppressing out-diffusion of, e.g. copper ions or atoms from the conductive base 310, or an auxiliary layer supporting a solder process. The auxiliary structure 320 may be partially or completely consumed during soldering in an area in the vertical projection of the semiconductor die 100. According to an embodiment, the auxiliary structure 320 is a layer or layer stack including nickel Ni or a plated nickel-phosphorus alloy NiP.

The semiconductor die 100 includes a semiconductor portion 110 and a conductive structure 120. The semiconductor portion 110 is provided from a single-crystalline semiconductor material, for example silicon Si, silicon carbide SiC, germanium Ge, a silicon germanium crystal SiGe, gallium nitride GaN or gallium arsenide GaAs.

A front side surface 111 and an opposite rear side surface 112 are parallel to each other in most parts. A normal to the front and rear side surfaces 111, 112 defines a vertical direction and directions parallel to the front and rear side surfaces 111, 112 are lateral directions. An outer surface 113 connecting the front and rear side surfaces 111, 112 is oriented in a direction tilted to the front and rear side surfaces 111, 112. According to an embodiment, the outer surface 113 runs vertical to the front and rear side surfaces 111, 112.

The semiconductor portion 110 may include impurity zones and impurity layers, conductive structures provided from metal, metal silicides, metal alloys or conductive semiconductor materials as well as insulator structures forming in total functional elements like diodes, IGFETs (insulated gate field effect transistors) including MOSFETs in the ordinary meaning including FETs with and without metal gate electrodes, IGBTs (insulated gate bipolar transistors), or thyristors, which may or may not be combined with logical circuits, driver circuits and circuits for digital or analog signal processing.

In accordance with an embodiment, the functional elements of the semiconductor die 100 form a power semiconductor device with a main current flowing in the vertical direction between the front and rear side surfaces 111, 112. The semiconductor die 100 may include one conductive electrode on the front side surface 111, for example an anode or cathode electrode of a diode. According to the illustrated embodiment, at least a gate electrode 130 and a source electrode 140 are provided on the front side surface 111. Other embodiments may provide further electrodes and contact pads, e.g. a field electrode. The electrodes, for example the gate and source electrodes 130, 140, on the front side surface 111 consist of or contain, as main constituent(s), aluminum Al, copper Cu, or alloys of aluminum or copper, for example AlSi, AlCu or AlSiCu.

The front side surface 111 may include a front side step or recess 182 along the outer surface 113. A dielectric structure 184 may line or fill the front side recess 182. The rear side surface 112 includes a rear side step or recess 192 along the outer surface 113. The rear side recess 192 may have a depth of at least 10 μm.

The conductive structure 120 is provided at a soldering side of the semiconductor portion 110. The conductive structure 120 directly adjoins the semiconductor portion 110 in at least a central surface portion 112a of the rear side surface 112, wherein the central surface portion 112a is provided at a distance to an outer surface 113 of the semiconductor portion 110. According to an embodiment, the conductive structure 120 is absent in an outermost surface portion 112c which is oriented parallel to the central surface portion 112a in the rear side recess 192 and directly adjoins the outer surface 113.

According to another embodiment, the conductive structure 120 directly adjoins the semiconductor portion 110 in the outermost surface portion 112c. The conductive structure 120 may cover an intermediate surface portion 112b tilted to the central surface portion 112a and connecting the central and outermost surface portions 112a, 112c completely or at least in a section oriented and connected to the central surface portion 112a.

The conductive structure 120 forms a rear side electrode and may include two or more conductive sub-layers. The sub-layers may contain, as main constituent(s), nickel Ni, titanium Ti, tungsten W, silver Ag, gold Au, platinum Pt and/or palladium Pd. For example, at least one of the sub-layers may contain one or more of Ni, Ti, Ag, Au, Pt, V, and Pd as main constituent(s), e.g. silicides and/or alloys. The conductive structure 120 may include one or more diffusion barrier layers, for example a titanium Ti layer and a nickel vanadium layer NiV. The conductive structure 120 may further include a soldering support layer, for example a layer containing or consisting of silver Ag and/or gold Au.

Between the semiconductor die 100 and the chip carrier 300, a soldered layer based on a solder material 200 electrically and mechanically connects the chip carrier 300 and the semiconductor die 100 through the conductive structure 120. The solder material 200 may contain or may not contain lead. According to an embodiment, the solder material 200 may be based on a soldering agent selected from a group containing PbSnAg and SbAgSn.

At the soldering side, the central surface portion 112a of the rear side surface 112 has a first distance to the chip carrier 300 and the outermost surface portion 112c has a second distance to the chip carrier 300. The second distance is greater than the first distance. The difference between the first and second distances is at least 10 µm. According to an embodiment, the difference is at least 20 µm or at least 50 µm.

As a result, no solder material 200 comes into contact with the outer surface 113 during a soldering process connecting the semiconductor die 100 and the chip carrier 300. Even if the outer surface 113 of the semiconductor portion 110 is partially or fully damaged, e.g. roughened due to dicing, no impurities diffuse out from the solder material 200 into the semiconductor portion 110. In case the semiconductor die 100 is obtained from a semiconductor wafer by a sawing process, portions of the semiconductor die 100 are prone to damages where the sawing blade leaves the semiconductor wafer and cuts through the conductive structure 120. Particles and metal splints may be torn away from the semiconductor wafer resulting in ruptures in the semiconductor portion 110 and/or the conductive structure 120.

During a diffusion soldering process the semiconductor die 100 may be pressed onto the chip carrier 300. According to the embodiments, that portion of the semiconductor die 100 along the outer surface 113 that emerges from a sawing process is not pressed against the chip carrier 300 during diffusion soldering. Hence particles cannot be trapped between the chip carrier 300 and the semiconductor die 100 in this region and potentially pre-damaged portions of the semiconductor die 100 are not subject to mechanical strain.

Figure 1B:
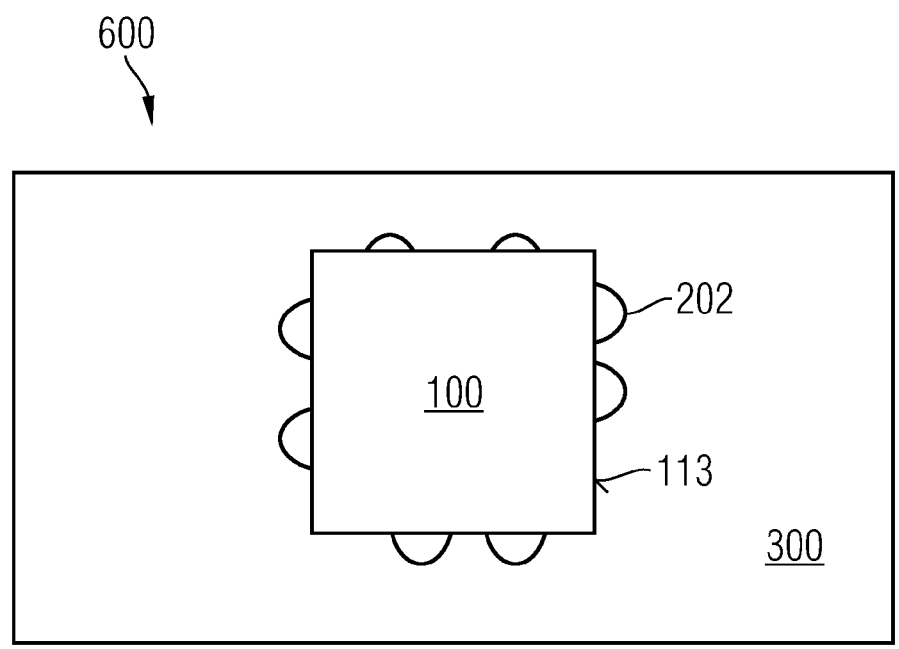
FIG. 1B is a schematic plan view of the semiconductor device assembly of FIG. 1A according to an embodiment using a high viscosity solder.
Figure 1C:
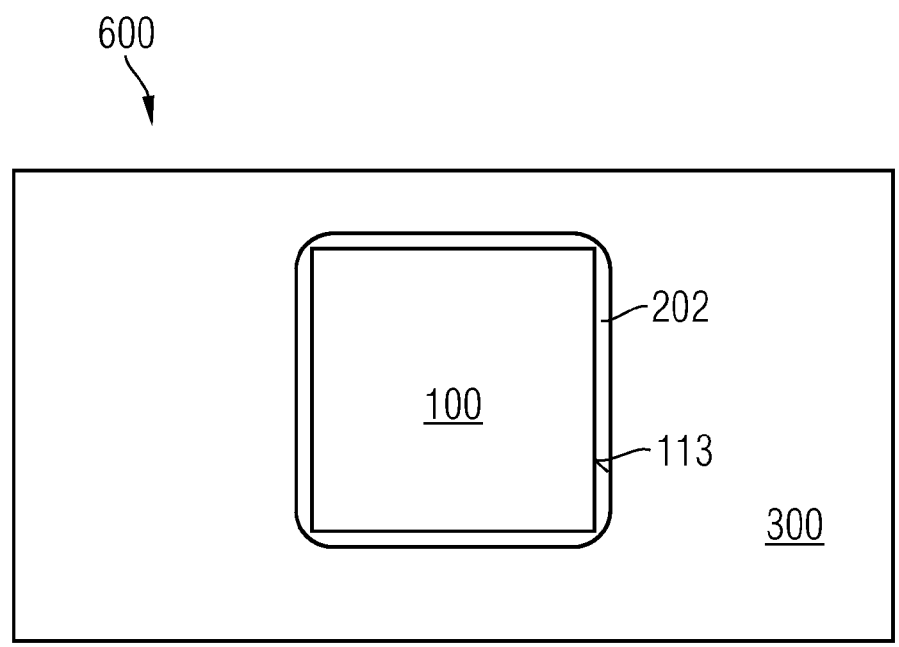
FIG. 1C is a schematic plan view of the semiconductor device assembly of FIG. 1A according to an embodiment using a low viscosity solder.

FIGS. 1B and 1C are plan views of the semiconductor device 600. The solder material 200 is provided between the semiconductor die 100 and the chip carrier 300. During soldering liquefied solder material 200 may bleed out from the gap between the semiconductor die 100 and the chip carrier 300. Portions 202 of the solder material 200 that bleed out may flow in the vertical direction along the outer edges of the semiconductor die 100.

For viscous high viscosity solder materials as used, for example, for diffusion soldering, the portions 202 form bubbles as illustrated in FIG. 1B. Thinner, low viscosity solder materials bleed out more uniformly along the perimeter of the semiconductor die 100 and the portions 202 form a frame around the semiconductor die 100 as illustrated in FIG. 1C.

In each case, the rear side recesses 192 prevent the liquefied solder material 200 from coating the outer surface 113 of the semiconductor portion 110 which is prone to sawing defects and which may be pre-damaged. Instead, the portions 202 of the liquefied solder material 200 coat surfaces in the rear side recesses 192 which are less prone to defects because they do not emerge from a sawing process and which are covered by portions of the conductive structure 120.

Figure 2:
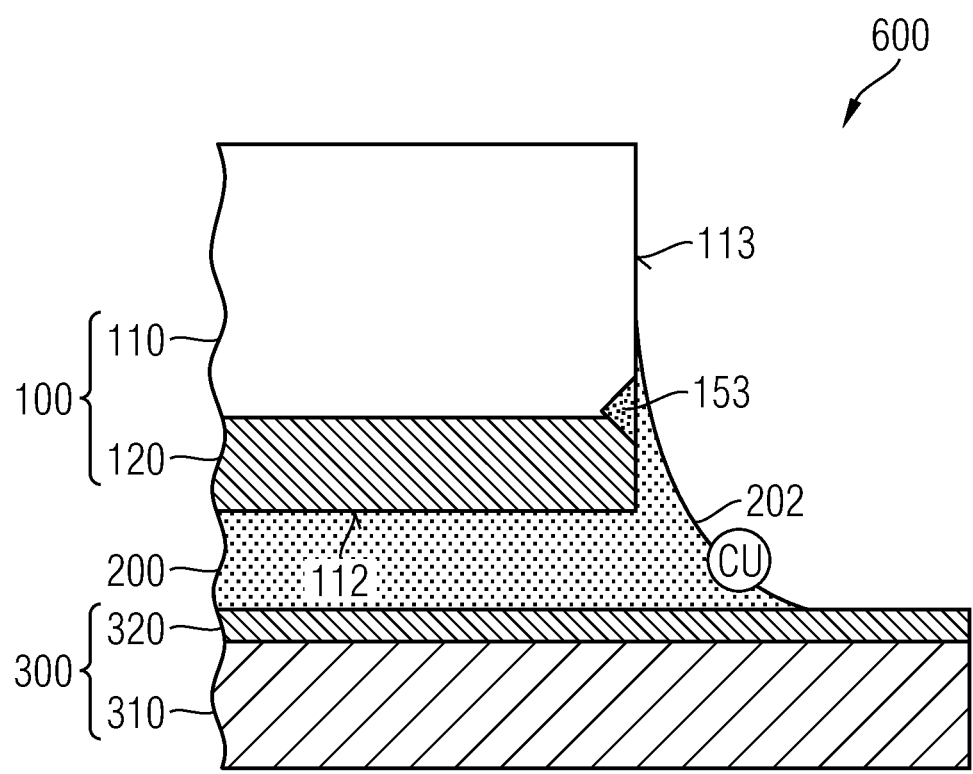
FIG. 2 is a schematic cross-sectional view of a portion of a semiconductor device assembly according to a comparative example for illustrating effects of the invention.

In a conventional semiconductor device 600 as shown in FIG. 2 the conductive structure 120 covers a rear side surface 112 of the semiconductor portion 110 of the semiconductor die 100. The outer surface 113 results from a separation process for separating semiconductor dies from a semiconductor wafer. The separation process may include a sawing process or laser cutting process. The separation process cuts through the conductive structure 120, too and the outer surface 113 may be damaged, for example along the interface to the conductive structure 120. Typically, a native oxide covers the outer surface 113 after the separation process, but the native oxide may be weak in portions where the separation process has damaged the semiconductor portion 110.

FIG. 2 shows a defect 153 where the native oxide is weak due to a pick-up process detaching semiconductor dies 100 from a foil and/or a separation process that damaged the separation surface, e.g. by generating fissures, cracks or lattice disturbances. During a solder process connecting the semiconductor die 100 to a chip carrier 300, portions of the solder material 200 may bleed out from the gap between the semiconductor die 100 and the chip carrier 300 and may coat the defect 153. The solder material 202 may contain impurities that pass through the defect portion 153 into the semiconductor die 100. For example, the solder material 202 may contain material released from the chip carrier 300, e.g. copper ions or atoms. Yet a small amount of copper impurities suffices to adversely affect significantly the functional elements formed in the semiconductor portion 110.

Copper silicide $Cu_5Si$ may form in small cracks or fissures generated by the separation process. Since copper silicide demands more space than its constituents, the formation of copper silicide expands initially narrow fissures such that the fissures widen up and propagate deeper into the semiconductor portion 110. Native oxide typically forms even on damaged crystal surfaces. However, solder processes, e.g. lead-free solder processes, significantly heat up the semiconductor portion 110 in an ambient without oxygen such that native oxides tend to crack over pre-damaged crystal surfaces. Hence even native oxides do not reliably prevent a pre-damaged region of the semiconductor portion 110 from getting exposed during soldering and from coming into contact with the solder material 200.

The above-discussed issues get even more significance with the rising need for thinner semiconductor portions 110 and thicker rear side electrodes.

By contrast, with the rear side recess 192 of FIG. 1, the outer surface 113 resulting from the separation process is sufficiently spaced from the chip carrier 300 and the solder material 200 does not coat the outer surface 113. Impurities are reliably barred from being transported through the solder material 200 to pre-damaged regions and from diffusing into the semiconductor portion 110.

The semiconductor device 600 of FIG. 3A includes a semiconductor die 100 with a semiconductor portion 110 made of a semiconductor material and including functional elements of, for example, a power semiconductor device 600. The semiconductor portion 110 has front and rear side surfaces 111, 112, which are parallel for the most part. The rear side surface 112 includes a rear side step or recess 192 along an outer surface 113 that connects the front and rear side surfaces 111, 112. A central surface portion 112a of the rear side surface 112 outside the rear side recess 192 has a first distance to a chip carrier 300. An outermost surface portion 112c in the rear side recess 192 is in substance parallel to the central surface portion 112a and has a second distance to the chip carrier 300. The second distance is greater than the first distance.

An intermediate surface portion 112b of the rear side surface 112 connects the central surface portion 112a and the outermost surface portion 112c. The intermediate surface portion 112b may run perpendicular to the central surface portion 112a or may be tilted to the central surface portion 112a at an angle between 0 degrees and 90 degrees, for example between 30 and 60 degrees. According to another embodiment, the intermediate surface portion 112b may be bowed.

A conductive structure 120 lines the central surface portion 112a, the intermediate surface portion 112b and the outermost surface portion 112c. The conductive structure 120 may include one, two or more sub-layers and covers an edge between the central and intermediate surface portions 112a, 112b. According to an embodiment, a first sub-layer 122 is a barrier layer that bars copper atoms/ions from migrating into the semiconductor portion 110. A second sub-layer 124 may be a further barrier layer made of a nickel vanadium alloy NiV. A third sub-layer 126 may be a soldering support layer that may be at least partially consumed during the soldering process. According to an embodiment, the soldering support layer forms at least partly a compound or alloy with one or more of the constituents of the solder material 200.

The chip carrier 300 may include a copper base or copper layer 310 and a conductive auxiliary structure 320 consisting of, for example, a nickel vanadium alloy. A solder material 200 electrically and mechanically connects the semiconductor die 100 and the chip carrier 300.

The conductive structure 120 covers all portions of the semiconductor portion 110 that the solder material 200 coats during soldering. Impurities, for example copper atoms/ions contained in the chip carrier 300, are effectively barred from diffusing into the semiconductor portion 110.

Figure 3B:
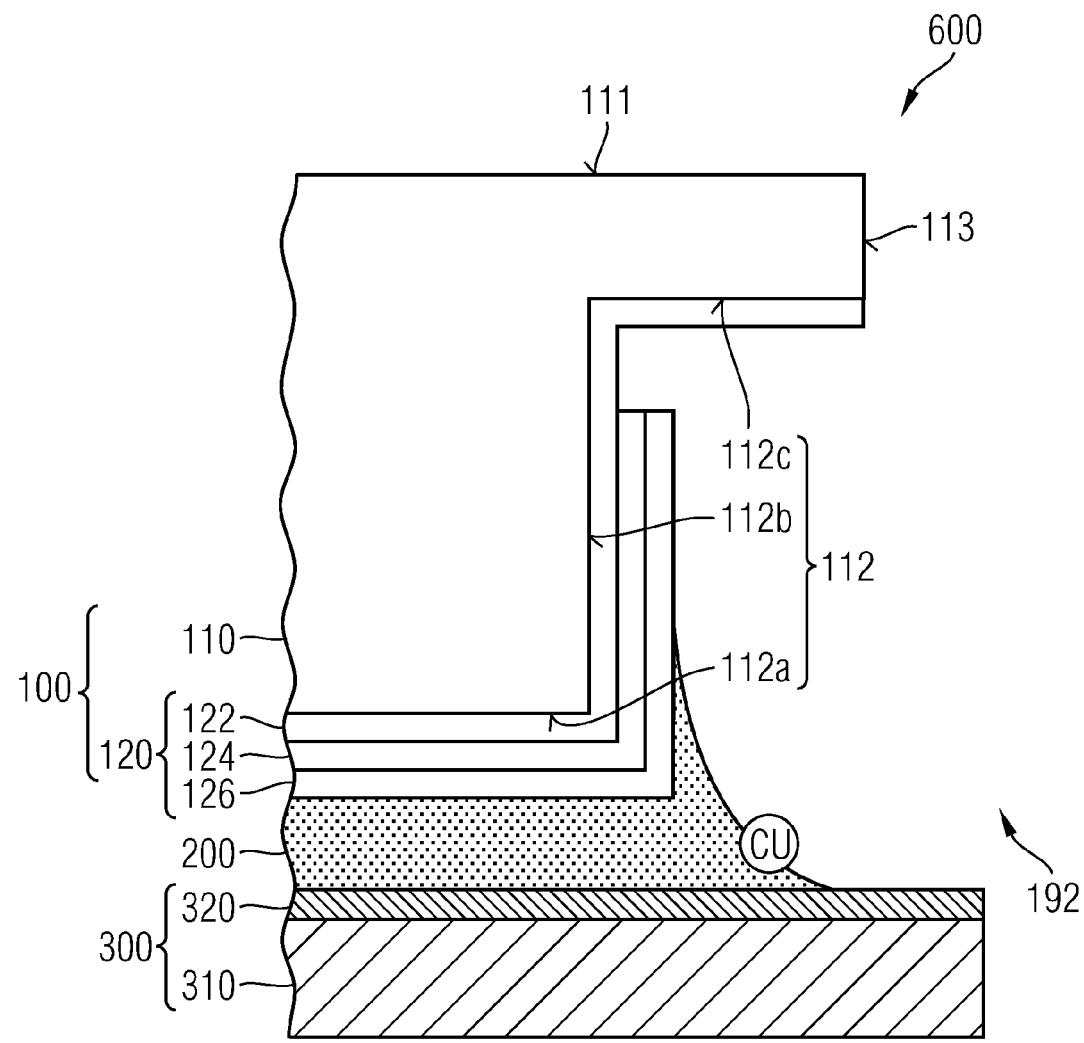
FIG. 3B is a schematic cross-sectional view of a portion of a semiconductor device assembly in accordance with an embodiment providing a partially covered step at the soldering side of a semiconductor die.

According to the embodiment of FIG. 3B a complete layer stack of the conductive structure 120 covers the central surface portion 112a and at least a section of the intermediate surface portion 112b oriented to and connected with the central surface portion 112a. Only a first portion of the conductive structure 120, for example the first sub-layer 122 covers a remaining section of the intermediate surface portion 112b and the outermost surface portion 112c. As a result, the separation process cuts through only the first sub-layer 122 of the conductive structure 120, which may be comparatively thin, for example at most 100 nm, such that the separation process is comparatively uncritical. On the other hand, a section of the rear side recess 192 oriented to the chip carrier 300 is provided with a dense barrier such that the risk for contamination is significantly lowered.

Figure 4A:
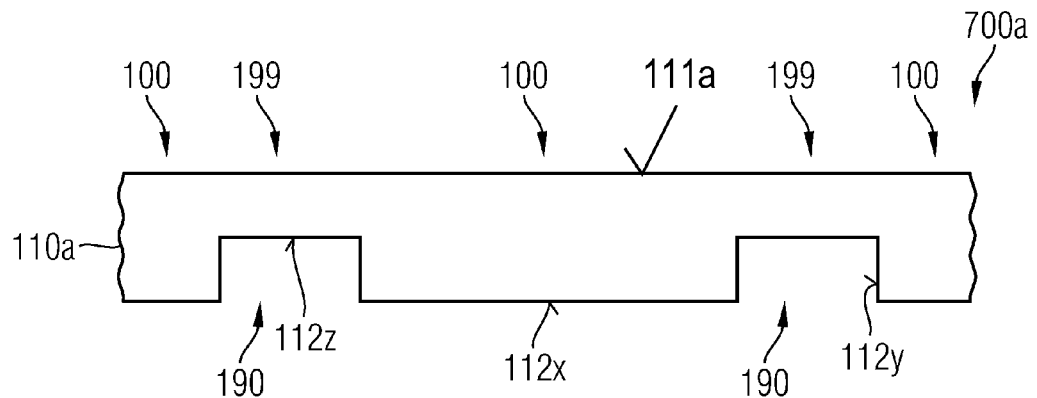
FIG. 4A is a schematic cross-sectional view of a portion of a semiconductor wafer for illustrating a method of manufacturing semiconductor devices in accordance with an embodiment providing fully covered steps at the solder side after introducing a separation trench from a rear side surface.
Figure 4B:
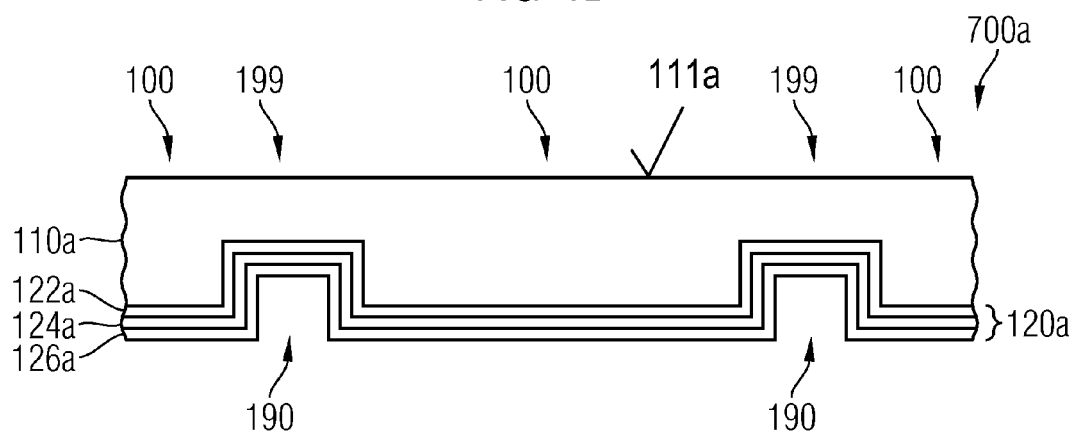
FIG. 4B shows the semiconductor wafer portion of FIG. 4A after providing a conductive layer.
Figure 4C:
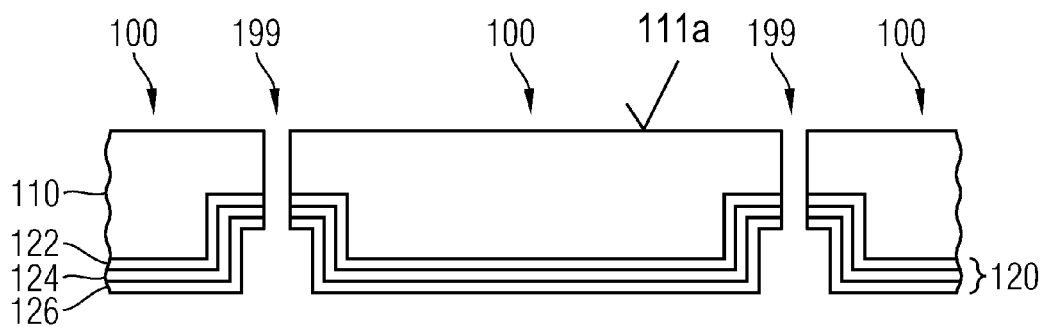
FIG. 4C shows semiconductor dies obtained from the semiconductor wafer portion of FIG. 4B.

FIGS. 4A to 4C refer to a method of manufacturing a semiconductor device 600. A plurality of semiconductor dies 100 is manufactured in a semiconductor wafer 700a. A semiconductor portion 110a of the semiconductor wafer 700a is provided from a single-crystalline semiconductor material, for example silicon Si, silicon carbide SiC, germanium Ge, a silicon germanium crystal SiGe, gallium nitride GaN or gallium arsenide GaAs. On a wafer front side surface 111a a sequence of processing steps are performed including deposition, etching and photolithographic patterning to form at least parts of functional elements of electronic devices like diodes, IGFETs, IGBTs, or thyristors. In addition, parts of or complete driver circuits, logic circuits and analog/digital signal processing circuits may be provided in the semiconductor portion 110a of the semiconductor wafer 700a.

The semiconductor dies 100 are arranged in a rectangular matrix. A kerf portion 199 of the semiconductor wafer 700a mechanically connects the semiconductor dies 100. The kerf portion 199 forms a rectangular grid with one of the semiconductor dies 100 formed in each mesh. From a temporary rear side surface 112x parallel to the wafer front side surface 111x, a lattice-like separation trench 190 is introduced into the semiconductor portion 110, for example by a masked anisotropic etch process.

FIG. 4A shows the semiconductor wafer 700a with the separation trench 190 introduced from the rear side surface 112x into the semiconductor portion 110a. The depth of the separation trench 190 may be at least 10 µm, for example 60 µm or more. The width of the separation trench 190 is greater than the width of the kerf portion 199, e.g. at least twice the width of the kerf portion 199. According to an embodiment, the width of the separation trench 190 may be at least 10 µm, for example 20 µm or more. The separation trench 190 is aligned to the kerf portion 199 such that the kerf portion 199 runs in the vertical projection of a center portion of the separation trench 190. A conductive layer structure 120a is formed on the temporary rear side surface 112x, for example by applying a conformal deposition method, e.g. electroplating.

FIG. 4B shows the conductive layer structure 120a that covers the temporary rear side surface 112x and that lines the separation trench 190. The conductive layer structure 120a may include a first layer 122a, a second layer 124a and a third layer 126a provided from different materials as described above. A separation process that includes, for example sawing, etching, breaking or a laser cut process separates the semiconductor dies 100 along the kerf portion 199, wherein etching, sawing and the laser cut consume the kerf portion 199.

FIG. 4C shows the separated semiconductor dies 100 which are suitable to obtain a semiconductor device 600 as illustrated in FIG. 3A FIGS. 5A to 5C refer to a method of manufacturing the semiconductor die 100 as illustrated in FIG. 3B. Starting from a semiconductor wafer 700a with a separation trench 190 introduced from a temporary rear side surface 112x into a semiconductor portion 110a of the semiconductor wafer 700a as illustrated in FIG. 4A, a first portion of the conductive layer structure 120a is deposited in a conformal manner. The first portion may include or consist of a first layer 122a, which may be a thin metal layer, for example a seed layer, an aluminum layer or a thin layer stack including at least a diffusion barrier layer. The thickness of the first portion of the conductive layer structure 120a may be at most 100 nm. At least a portion of the separation trench 190 may be filled with a first auxiliary material 410. Then a second portion of the conductive layer structure 120a is deposited, for example using an electroplating process.

Figure 5A:
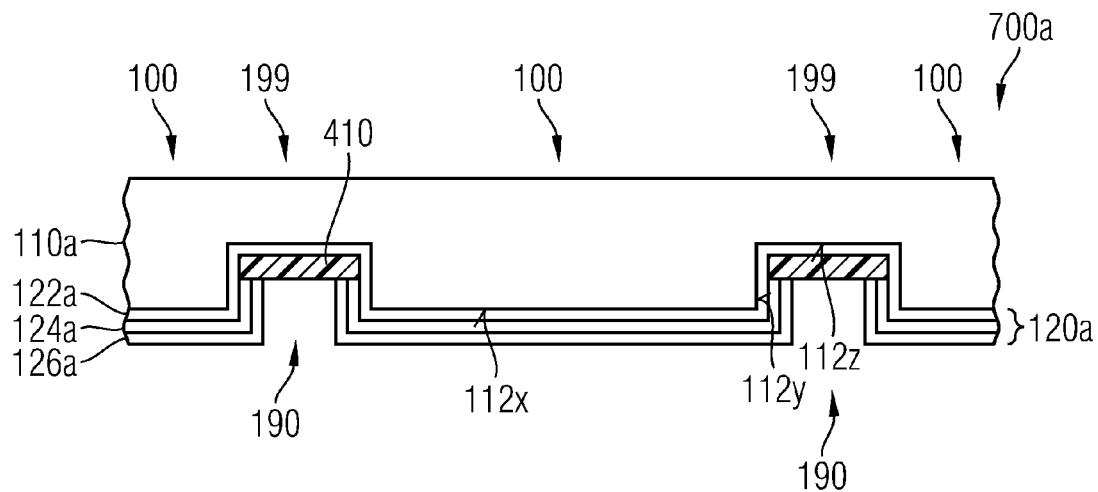
FIG. 5A is a schematic cross-sectional view of a portion of a semiconductor wafer for illustrating a method of manufacturing semiconductor devices in accordance with an embodiment providing partially covered steps at the solder side after providing second sections of a conductive layer.

FIG. 5A shows the first layer 122a forming the first portion and lining the separation trench 190. The first auxiliary material 410 is provided on the first layer 122a. The first auxiliary material 410 may be a dielectric material such that the second portion, which may include a second and a third layer 123, 124, is not deposited on the first auxiliary material 410. According to an embodiment, the first auxiliary material 410 is removed. For example, the first auxiliary material 410 is readily soluble, for example a photoresist material, and a suitable solvent is applied on the rear side surface 112x.

Figure 5B:
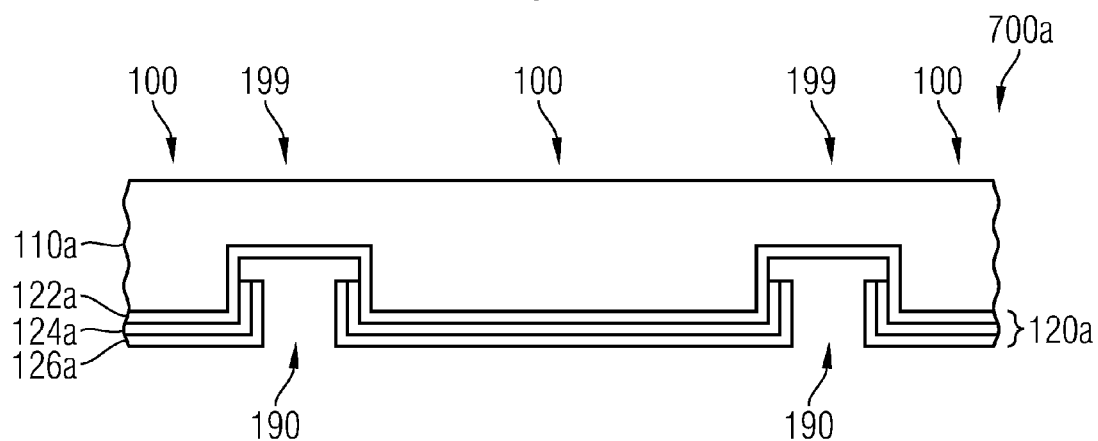
FIG. 5B shows the semiconductor wafer portion of FIG. 5A after removing a first auxiliary material.
Figure 5C:
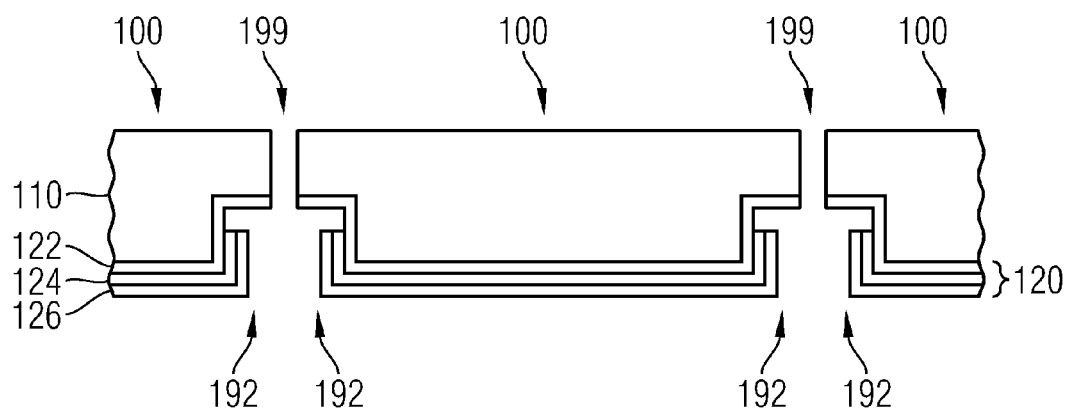
FIG. 5C shows semiconductor dies obtained from the semiconductor wafer portion of FIG. 5B.

FIG. 5B shows the separation trench 190 free from the first auxiliary material 410. Then a separation process separates the semiconductor dies 100 in the kerf portion 199. According to another embodiment, the first auxiliary material 410 is not removed before the separation process. Since the separation process does not cut through the second and third layers 124, 126, the separation process is simplified and more reliable. On the other hand, the separation trench 190 on wafer level results in rear side steps 192 which when coated by a solder material or when otherwise affected by the soldering process are protected by the comparatively dense conductive structure 120 formed by the separation process from the conductive layer structure 120a.

FIGS. 6A to 6C refer to another method of manufacturing a semiconductor device 600. Starting from the semiconductor wafer of FIG. 4A, a second auxiliary material 420 is filled into a portion of the separation trench 190. A conductive layer structure 120a is provided using non-conformal deposition methods such that no or only few material is deposited along the sidewalls 112y of the separation trench 190.

FIG. 6A shows the second auxiliary material 420 filling a portion of the separation trench 190. The conductive layer structure 120a does not cover the sidewalls 112y of the separation trench 190.

The second auxiliary material 420 is removed, wherein portions of the conductive layer structure 120a formed in the separation trench 190 are lifted off. For example, the second auxiliary material 420 is a readily soluble material, for example a photo resist, and a suitable solvent is applied to the semiconductor wafer 700a.

As shown in FIG. 6B the separation trench 190 is free from portions of the conductive layer structure 120a. A separation process separates the semiconductor dies 100 along the kerf portion 199 as shown in FIG. 6C.

Figure 7A:
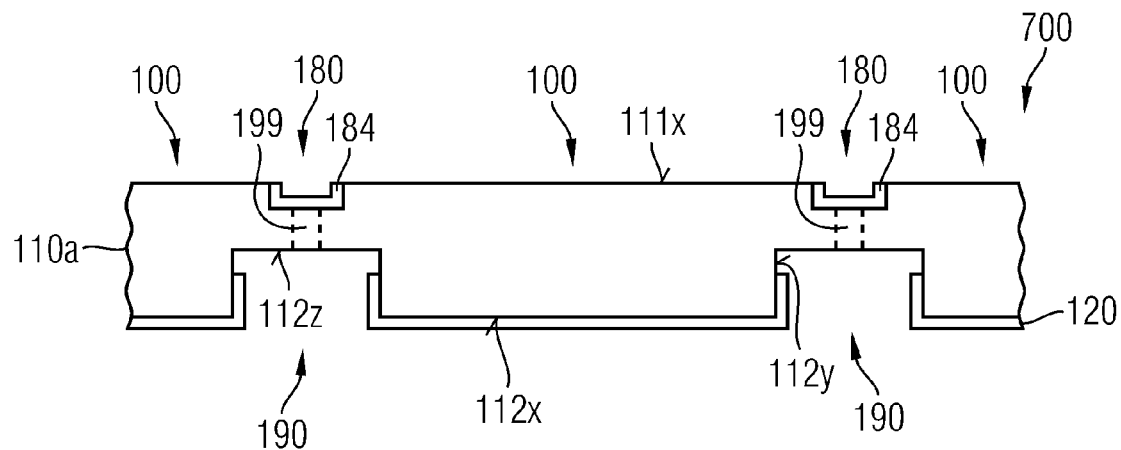
FIG. 7A is a schematic cross-sectional view of a portion of a semiconductor wafer in accordance with an embodiment providing a separation trench with vertical sidewalls.

FIG. 7A shows a portion of a semiconductor wafer 700 that includes identical semiconductor dies 100 arranged in a matrix. A kerf portion 199 connects the semiconductor dies 100. The kerf portion 199 forms a grid with the semiconductor dies 100 arranged in the meshes of the grid. In the semiconductor dies 100 functional elements are formed by applying processes like lithographic patterning, deposition and etching mainly from a wafer front side surface 111x. One or more insulator trenches 180 oriented along the kerf portion 199 may be introduced from the wafer front side surface 111x into a semiconductor portion 110a of the semiconductor wafer 700. The insulator trench 180 may be wider than the kerf portion 199 whose width is given by the distance between neighboring semiconductor dies 100. A dielectric structure 184 may line or fill the insulator trench 180.

At a rear side opposed to the wafer front side surface 111x the kerf portion 199 includes a grid-like or lattice-like separation trench 190 introduced into the semiconductor portion 110a from the rear side. The separation trench 190 is wider than the kerf portion 199 and the kerf portion 199 is positioned approximately in a vertical projection of a center portion of the separation trench 190.

The depth of the separation trench 190 is at least 10 μm in relation to central die surfaces 112x, which are defined between sections of the separation trench 190. A trench bottom surface 112z of the separation trench 190 may be in substance parallel to the central die surfaces 112x. Trench sidewall surfaces 112y of the separation trench 190 connect the central die surfaces 112x and the trench bottom surface 112z. The trench sidewall surfaces 112y may run perpendicular to the central die surfaces 112x or may be tilted to them at an angle between 0 and 90 degrees, e.g. from 30 to 60 degrees.

A conductive structure 120 is provided for each semiconductor die 100 on the respective central die surface 112x. The conductive structure 120 may cover the central die surface 112x and at least portions of the trench sidewall surfaces 112y.

Figure 7B:
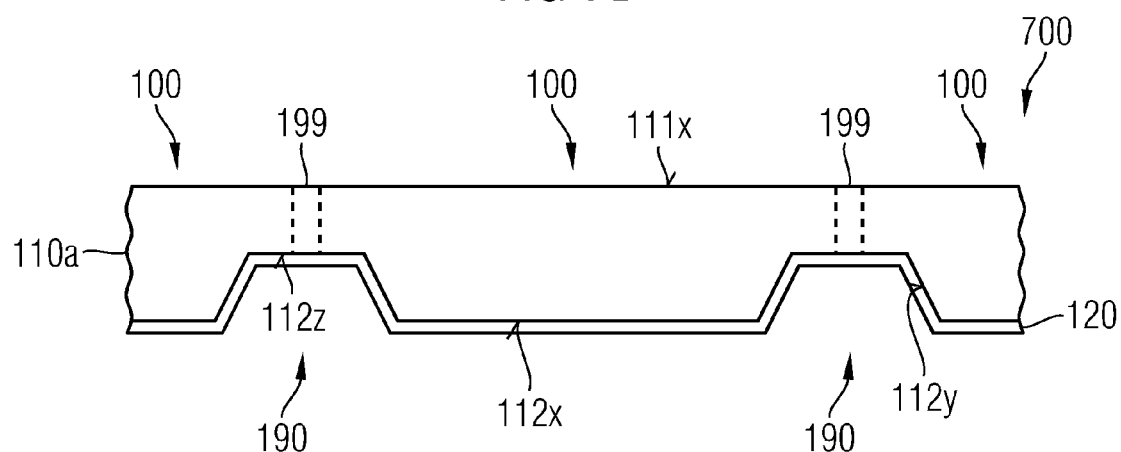
FIG. 7B is a schematic cross-sectional view of a portion of a semiconductor wafer in accordance with an embodiment providing a separation trench with tilted sidewalls.

The semiconductor wafer 700 of FIG. 7B includes a continuous conductive structure 120 covering the central die surfaces 112x, the trench sidewall surfaces 112y and the trench bottom surfaces 112z. The trench sidewalls surfaces 112y are tilted at an angle between 30 and 60 degrees, for example 45 degrees against the central die surfaces 112x. The sidewall surfaces 112y may be <111> crystallographic surfaces of a silicon crystal. The separation trench 190 of FIG. 7B may emerge from a masked etch using an alkaline solution with an etch rate depending on the crystallographic orientation in a semiconductor crystal. For example, alkaline solutions like potassium hydroxide KOH, tetramethyl ammonium hydroxide TMAH, ammonium hydroxide NH$_4$OH, choline, and others etch <111> crystallographic planes, which have a higher package density, at a lower etch rate than other crystallographic planes.

The shallower slopes ensure a more reliable coverage by the conductive structure 120, whereas steeper slopes may result in a thinning of a barrier layer contained in the conductive structure 120. Other embodiments may provide a damage implant with ions, e.g. Ag, in order to locally increase the etch rate for tuning the etch profile without the need for considering the orientation of the crystallographic planes. After the damage implant and before providing the conductive structure 120, the semiconductor portion 110 may be etched to remove possibly damaged portions. The damage implant may be combined with impurity implants provided from the rear side for other reasons.

Figure 7C:
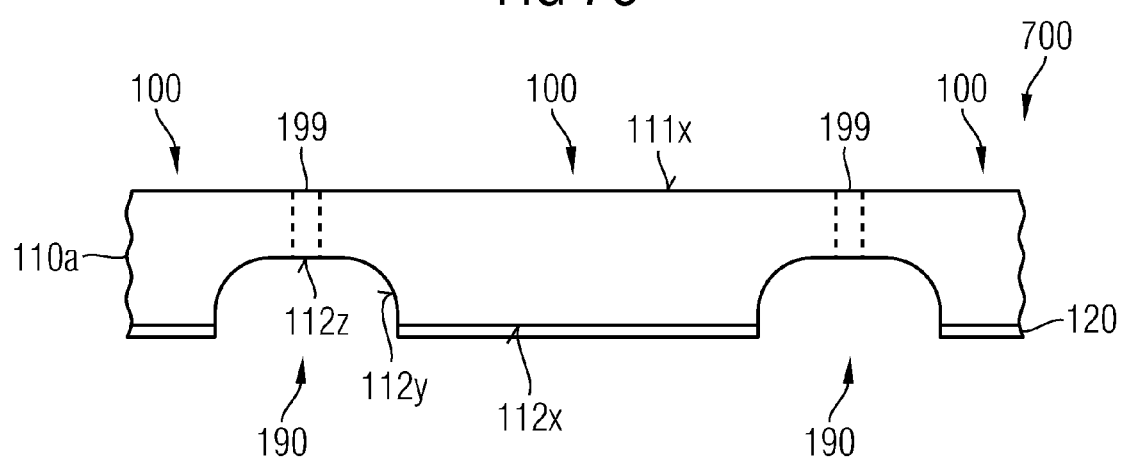
FIG. 7C is a schematic cross-sectional view of a portion of a semiconductor wafer in accordance with an embodiment providing a separation trench with curved sidewalls.

The semiconductor wafer 700 of FIG. 7C shows a conductive structure 120, which is completely absent in the separation trench 190 and which covers only the central die surfaces 112x. The separation trench 190 may have bowed trench sidewall surfaces 112y and may be formed by a highly isotropic wet or dry etch.

Figure 8:
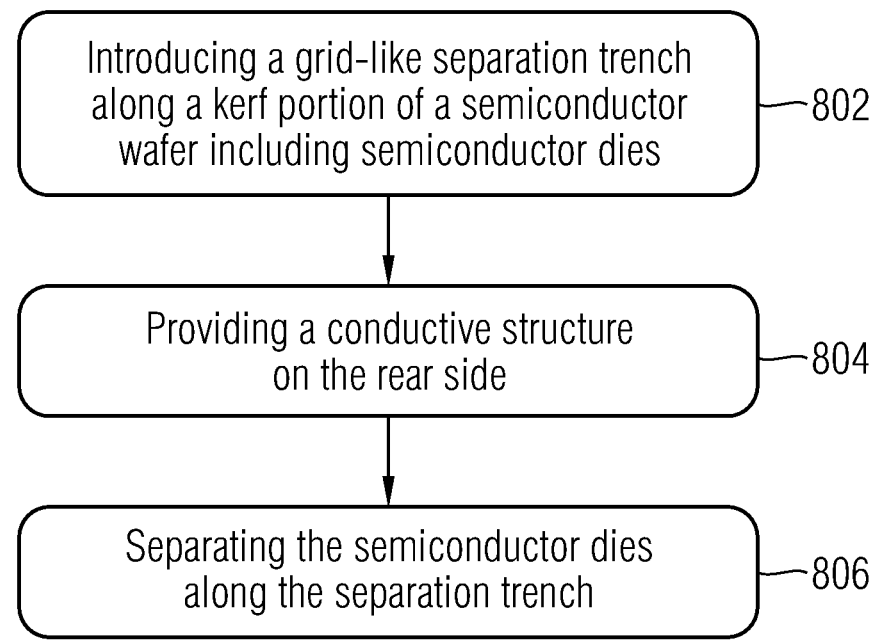
FIG. 8 is a simplified flowchart illustrating a method of manufacturing a semiconductor device according to a further embodiment.
Figure 9:
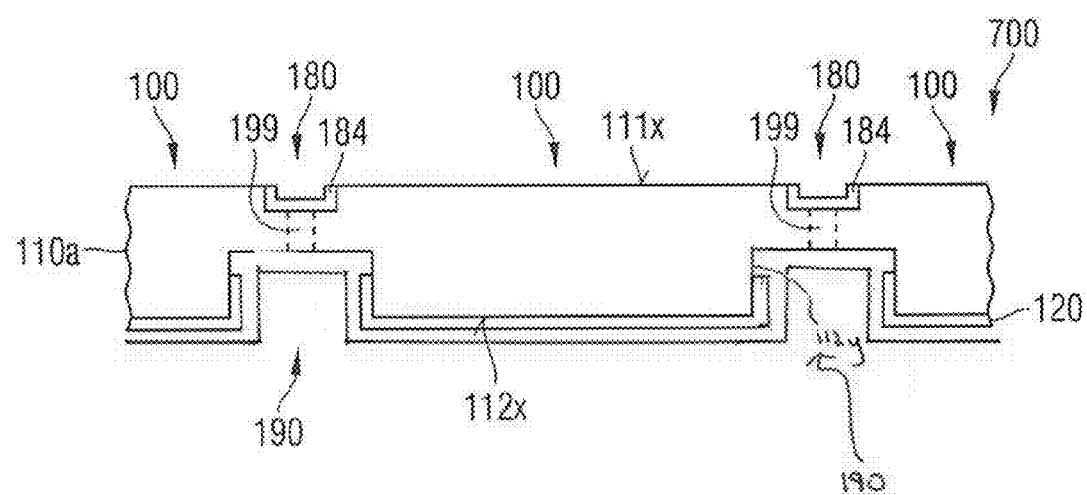
FIG. 9 illustrates a protection layer on a section of an intermediate surface portion not covered by a conductive structure, according to an embodiment.

FIG. 8 refers to a method of manufacturing a semiconductor device 600 according to another embodiment. From a rear side surface, a grid-like separation trench is introduced along a kerf portion into a semiconductor portion 110 of a semiconductor wafer, wherein the semiconductor wafer includes a plurality of identical semiconductor dies 100 which are arranged in a matrix and which are mechanically connected by the kerf portion (802) The separation trench is wider than the kerf portion. A conductive structure extending into the separation trench is provided on the rear side surface (804). The semiconductor dies 100 are separated along the kerf portion (806), wherein the process leaves sidewalls of the separation trench unaffected. An outer surface of the semiconductor die 100 resulting from the separation process and prone to damages the separation process typically induces in the concerned surfaces is formed at a distance to a central die surface, which is soldered onto a chip carrier 300. The solder material is effectively prevented from coating such semiconductor surfaces that are prone to damages and solder-induced contamination is significantly reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device assembly comprising:
a chip carrier;
a semiconductor die comprising a semiconductor portion and a conductive structure;
a soldered layer mechanically and electrically connecting the chip carrier and the conductive structure at a soldering side of the semiconductor die, wherein
at the soldering side an outermost surface portion of a rear side surface of the semiconductor portion along an edge of the semiconductor die has a greater distance to the chip carrier than a central surface portion of the rear side surface, and
the conductive structure covers the central surface portion and at least a section of an intermediate surface portion tilted to the central surface portion and connecting the central and outermost surface portions, and wherein the conductive structure comprises at least a conformal metal first sub-layer forming a barrier layer impermeable for copper ions and atoms and a second sub-layer from at least one of Ni, V, Au, Ag, W, Pt and Pd between the first sub-layer and the soldered layer, the first sub-layer covering the central surface portion, the intermediate surface portion and the outermost surface portion of the rear side surface, and the second sub-layer being present along the central surface portion and at least a portion of the intermediate surface portion and is absent along the outermost surface portion.

2. The semiconductor device assembly according to claim 1, wherein
the central surface portion has a first distance and the outermost surface portion has a second distance to the chip carrier and a difference between the first and second distances is at least 10 µm.

3. The semiconductor device assembly according to claim 1, wherein
the central and outermost surface portions are parallel.

4. The semiconductor device assembly according to claim 1, wherein
the conductive structure is absent on the outermost surface portion.

5. The semiconductor device assembly according to claim 1, wherein
the conductive structure is provided on the intermediate and outermost surface portions.

6. The semiconductor device according to claim 1, wherein
the first sub-layer directly adjoins the semiconductor portion.

7. The semiconductor device according to claim 1, wherein
the second sub-layer comprises NiV.

8. A semiconductor wafer comprising:
semiconductor dies arranged in a matrix, wherein each semiconductor die includes a conductive structure on a central die surface at a rear side of the semiconductor wafer, and
a kerf portion mechanically connecting the semiconductor dies and forming a rectangular grid with the semiconductor dies arranged in meshes of the grid, wherein
a lattice-like separation trench extends into the semiconductor wafer from the rear side between the central die surfaces, the separation trench being wider than the kerf portion, wherein
the conductive structure extends into the separation trench, and wherein the conductive structure comprises at least a conformal metal first sub-layer forming a barrier layer impermeable for copper ions and atoms and a second sub-layer from at least one of Ni, V, Au, Ag, W, Pt and Pd, wherein the first sub-layer is between the central die surface and the second sub-layer and the second sub-layer is absent along the bottom of the lattice-like separation trench.

\* \* \* \* \*